United States Patent
Okumura et al.

(10) Patent No.: US 7,157,315 B2
(45) Date of Patent: *Jan. 2, 2007

(54) ACTIVE MATRIX SUBSTRATE AND METHOD OF FABRICATING THE SAME

(75) Inventors: Hiroshi Okumura, Tokyo (JP); Osamu Sukegawa, Tokyo (JP)

(73) Assignee: NEC LCD Technologies, Ltd. (JP)

(*) Notice: Subject to any disclaimer, the term of this patent is extended or adjusted under 35 U.S.C. 154(b) by 198 days.

This patent is subject to a terminal disclaimer.

(21) Appl. No.: 10/778,442

(22) Filed: Feb. 13, 2004

(65) Prior Publication Data

US 2004/0159840 A1 Aug. 19, 2004

Related U.S. Application Data

(62) Division of application No. 10/114,093, filed on Apr. 2, 2002, now Pat. No. 6,734,460.

(30) Foreign Application Priority Data

Apr. 3, 2001 (JP) ............................. 2001-104570

(51) Int. Cl.
*H01L 21/84* (2006.01)

(52) U.S. Cl. ..................... 438/149; 438/155; 438/164; 438/166; 257/E21.561

(58) Field of Classification Search ................ 438/149, 438/151, 164, 166, 479, 517, 160, 155; 349/28, 349/49, 50; 257/E21.561
See application file for complete search history.

(56) References Cited

U.S. PATENT DOCUMENTS

| | | | | |
|---|---|---|---|---|
| 5,476,810 A | * | 12/1995 | Curran | 349/28 |
| 6,067,062 A | * | 5/2000 | Takasu et al. | 345/87 |
| 6,921,685 B1 | * | 7/2005 | Okumura | 438/149 |
| 2001/0022644 A1 | * | 9/2001 | Hinata | 349/149 |
| 2003/0001813 A1 | * | 1/2003 | Sekiguchi | 345/96 |

FOREIGN PATENT DOCUMENTS

| | | |
|---|---|---|
| JP | 63-123024 | 5/1988 |
| JP | 7-074374 | 3/1995 |
| JP | 10-173194 | 6/1998 |
| JP | 11-103064 | 4/1999 |
| JP | 11-174424 | 7/1999 |
| JP | 11-231300 | 8/1999 |

* cited by examiner

*Primary Examiner*—Minh-Loan Tran
(74) *Attorney, Agent, or Firm*—Hayes Soloway P.C.

(57) ABSTRACT

An active matrix substrate includes a substrate composed of resin, and a polysilicon thin film diode formed on the substrate. The polysilicon thin film diode may be a lateral diode centrally having a region into which impurity is doped. As an alternative, the polysilicon thin film diode may be comprised of two lateral diodes electrically connected in parallel to each other and arranged in opposite directions.

10 Claims, 15 Drawing Sheets

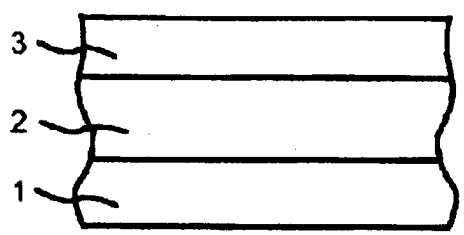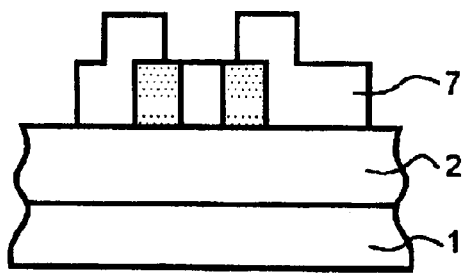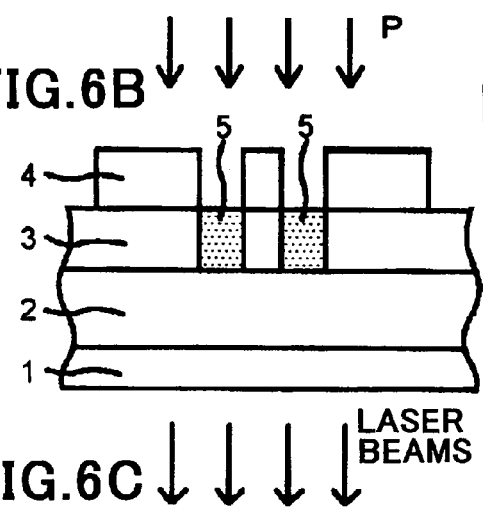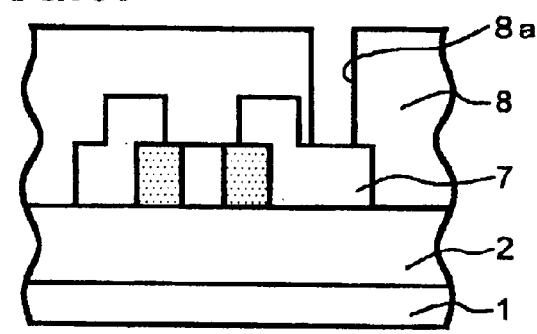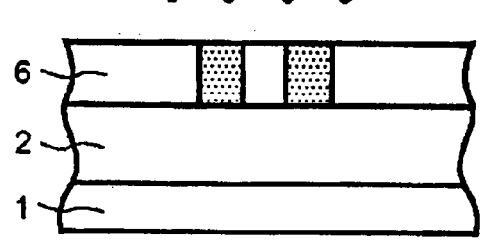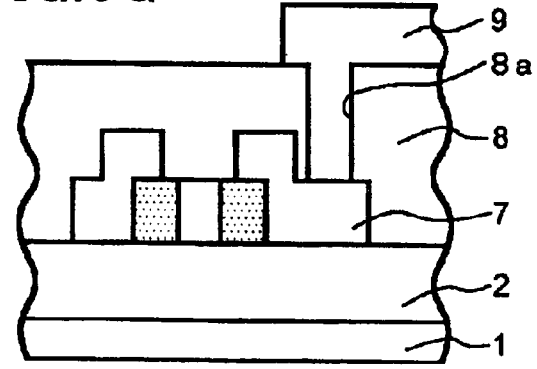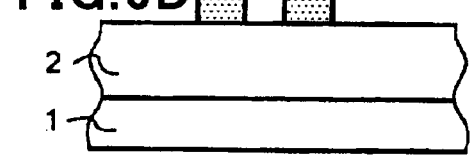

ACTIVE MATRIX SUBSTRATE AND METHOD OF FABRICATING THE SAME

This Application is a divisional application of U.S. application Ser. No. 10/114,093, filed Apr. 2, 2002, now U.S. Pat. No. 6,734,460, issued May 11, 2004.

BACKGROUND OF THE INVENTION

1. Field of the Invention

The invention relates to an active matrix substrate partially constituting a liquid crystal display device, and a method of fabricating the same.

2. Description of the Related Art

FIG. 1 is a cross-sectional view of a conventional active matrix substrate 100 partially constituting a liquid crystal display device.

The active matrix substrate 100 is comprised of a glass substrate 101, a thin chromium (Cr) film 102 formed as a gate electrode partially on the glass substrate 101, a silicon nitride film 103 formed as an electrically insulating film, covering the thin chromium film 102 and the glass substrate 101 therewith, an active layer 104 formed on the silicon nitride film 103, n+ doped amorphous silicon film 105 formed partially on the active layer 104, a thin chromium (Cr) film 106 formed as a barrier film on the n+ doped amorphous silicon film 105, and an indium tin oxide (ITO) film 107 which will make a pixel electrode and which makes contact with the thin chromium film 106, and covers the silicon nitride film 103 therewith.

The active matrix substrate 100 is fabricated as follows.

First, the thin chromium film 102 which will define a gate electrode is formed on the glass substrate 101 by sputtering. Then, the thin chromium film 102 is patterned into a gate electrode.

Then, the silicon nitride film 103, the active layer 104 and the n+ doped amorphous silicon film 105 are successively formed on the glass substrate 101 by plasma-enhance chemical vapor deposition (PECVD) at 300 degrees centigrade.

Then, a data wiring layer comprised of the active layer 104 and the n+ doped amorphous silicon film 105 is patterned into an island by photolithography and dry etching.

Then, the thin chromium film 106 is formed on the n+ doped amorphous silicon film 105 by sputtering. The thin chromium film 106 acts as a barrier layer between the data wiring layer and the ITO film 107.

Then, the thin chromium film 106 and the n+ doped amorphous silicon film 105 are patterned.

Then, the ITO film 107 which will define a pixel electrode is formed by sputtering, and then, is patterned.

Thus, the active matrix substrate 100 including a thin film transistor having an amorphous silicon film, as a switching device, is fabricated through the above-mentioned steps.

Since glass has a high specific gravity, the active matrix substrate 100 including the glass substrate 101 is relatively heavy.

In particular, since glass is readily broken, the glass substrate 101 has to be formed to have a great thickness, resulting that the active matrix substrate 100 is unavoidably heavy.

These days, a liquid crystal display device is required to be light and thin, and hence, an active matrix substrate which is a part of a liquid crystal display device has to be fabricated lighter and thinner.

However, for the reasons mentioned above, there is limitation in fabricating a liquid crystal display device including a glass substrate, lighter and thinner.

Consequently, in order to fabricate a liquid crystal display device lighter and thinner, many attempts have been made to use a resin substrate in place of a glass substrate, because a resin substrate is lighter than a glass substrate and can be fabricated thinner than a glass substrate.

For instance, Japanese Unexamined Patent Publication No. 11-103064 (A) has suggested an active matrix substrate including a thin film transistor (TFT) as a switching device which thin film transistor is comprised of a thin polysilicon film formed on a resin substrate.

A thin film transistor includes a gate insulating film as an indispensable part. A gate insulating film is formed generally by plasma-enhanced chemical vapor deposition (PECVD) or sputtering.

A resin substrate generally has about 200 degrees centigrade as a maximum resistance to heat. The inventors had conducted various experiments, and found out that a gate insulating film formed by PECVD or sputtering at 200 degrees centigrade or lower, which is a maximum resistance of a resin substrate to heat, would have a low density and cause much current leakage, resulting in that the gate insulating film was not practicable. Accordingly, even if steps other than a step of forming a gate insulating film were carried out at 200 degrees centigrade or lower, it would be impossible to form a high-quality gate insulating film.

In the above-mentioned experiments, the inventors had also found out that a gate insulating film formed by PECVD or sputtering at 300 degrees centigrade or higher had a high density and had caused only small current leakage, and hence, the gate insulating film was sufficiently practicable.

However, 300 degrees centigrade is over a maximum resistance of a resin substrate to heat. Hence, if PECVD or sputtering were carried out at 300 degrees centigrade or higher for forming a gate insulating film, a resin substrate would be thermally destroyed.

Japanese Unexamined Patent Publication No. 10-173194 (A) has suggested a method of fabricating a semiconductor device, including the steps of forming a first inorganic insulating thin film on a resin substrate or resin film without exposing a surface on which the first inorganic insulating thin film is to be formed, to plasma, forming a second inorganic insulating thin film on the first inorganic insulating thin film with the surface being exposed to plasma, and forming a thin semiconductor film on either the first inorganic insulating thin film or the second inorganic insulating thin film.

Japanese Unexamined Patent Publication No. 11-174424 (A) has suggested a substrate to be used for a liquid crystal display panel which substrate is composed of copolymer polycarbonate resin containing 3, 3, 5-trimethyl-1,1-di(4-phenol) cyclohexyridene, bisphenol, and bisphenol constituents wherein the bisphenol is contained in the range of 30 to 99 mol %.

Japanese Unexamined Patent Publication No. 7-74374 (A) has suggested a thin film diode including a first electrode layer formed on a substrate, a semiconductor layer formed on the first electrode layer, a buffer layer formed on the semiconductor layer, and a second electrode layer formed on the buffer layer, wherein the semiconductor layer and the buffer layer have almost the same pattern as each other.

The above-mentioned problem remains unsolved even in the above-mentioned Publications.

SUMMARY OF THE INVENTION

In view of the above-mentioned problem in the prior active matrix substrates, it is an object of the present invention to provide an active matrix substrate which includes a resin substrate and is capable of avoiding thermal destruction of a resin substrate.

In view of the shortcomings in the above-mentioned conventional active matrix substrates, the inventors paid attention to a diode which is not necessary to include a gate insulating film. That is, the inventors selected a diode as a switching device to be used for an active matrix substrate, in place of a thin film transistor.

In one aspect of the present invention, there is provided an active matrix substrate including (a) a substrate composed of resin, and (b) a polysilicon thin film diode formed on the substrate.

The active matrix substrate in accordance with the present invention is not necessary to include a gate insulating film having low quality and low reliability, unlike a conventional active matrix substrate including a thin film transistor, ensuring enhancement in performances and reliability.

In addition, it is possible to use a resin substrate having a smaller thickness than a glass substrate in the active matrix substrate in accordance with the present invention. Hence, in comparison with an active matrix substrate including a glass substrate, it would be possible to reduce a height of an active matrix substrate, and hence, a height of a liquid crystal display device including the active matrix substrate in accordance with the present invention.

It is preferable that the polysilicon thin film diode is formed as a lateral diode.

If the polysilicon thin film diode were formed as a vertical diode, it would be necessary to carry out film deposition and laser annealing a plurality of times. If an upper film is annealed by radiating laser beams thereto, a profile of an impurity concentration in a lower film might be destroyed. Furthermore, if film deposition and laser annealing were not carried out in vacuum, a natural oxidation film would be formed between layers. Since a lateral diode can be formed without causing such problems as mentioned above, it is preferable that the polysilicon thin film diode is formed as a longitudinal diode.

It is preferable that the lateral diode centrally has a region into which impurity is doped.

The lateral diode may be designed to have a nin structure, a pip structure, an ini structure or an ipi structure.

As an alternative, the lateral diode may be designed to have ni- or pi-Schottky structure.

The polysilicon thin film diode may be comprised of two lateral diodes electrically connected in parallel to each other and arranged in opposite directions.

The substrate may be composed of polyethersulfon, polyimide, polycarbonate or siloxane.

The active matrix substrate may be designed to further include a light-shielding film formed below the polysilicon thin film diode.

The light-shielding film may be comprised of a chromium film.

The active matrix substrate in accordance with the present invention may be applied to a light-transmission type liquid crystal display device, a COT type liquid crystal display device or a light-reflection type liquid crystal display device.

In another aspect of the present invention, there is provided a method of fabricating an active matrix substrate, including the steps of (a) forming an amorphous silicon film on a substrate composed of resin, (b) doping impurity into the amorphous silicon film in a selected region thereof, (c) radiating laser beams to the amorphous silicon film for crystallizing the amorphous silicon film into a polysilicon film, and (d) patterning the polysilicon film into an island to thereby form a parallel-type diode.

There is further provided a method of fabricating an active matrix substrate, including the steps of (a) forming an electrically insulating film on a substrate composed of resin, (b) forming an amorphous silicon film on the electrically insulating film, (c) doping impurity into the amorphous silicon film in a selected region thereof, (d) radiating laser beams to the amorphous silicon film for crystallizing the amorphous silicon film into a polysilicon film, (e) patterning the polysilicon film into an island, (f) forming a metal wiring such that the metal wire makes electrical contact with the island-shaped polysilicon film, (g) forming an interlayer insulating film all over a product resulted from the step (f), (h) forming a contact hole through the interlayer insulating film such that the contact hole reaches the metal wire, and (i) forming a metal film which will define a pixel electrode such that the contact hole is filled with the metal film.

The metal film to be formed in the step (i) may be an electrically conductive transparent film such as an indium tin oxide (ITO) film. The metal film may be annealed.

The method may further include the step of (j) annealing the polysilicon film. The step (j) is to be carried out between the steps (d) and (e).

The method may further include the step of (k) applying hydrogen plasma to the polysilicon film.

The method may further include the step of (l) forming a light-shielding film on the resin substrate.

An active matrix substrate formed by the above-mentioned methods may be applied to a light-transmission type liquid crystal display device or a COT type liquid crystal display device.

There is still further provided a method of fabricating an active matrix substrate, including the steps of (a) forming an electrically insulating film on a substrate composed of resin, (b) forming an amorphous silicon film on the electrically insulating film, (c) doping impurity into the amorphous silicon film in a selected region thereof, (d) radiating laser beams to the amorphous silicon film for crystallizing the amorphous silicon film into a polysilicon film, (e) patterning the polysilicon film into an island, (f) forming a metal wiring such that the metal wire makes electrical contact with the island-shaped polysilicon film, (g) coating a photosensitive film over a product resulted from the step (f), exposing the photosensitive film to a light, and developing the photosensitive film to thereby form base steps in a region in which a pixel is to be formed, (h) forming an interlayer insulating film all over a product resulted from the step (g), (i) forming a contact hole through the interlayer insulating film such that the contact hole reaches the metal wire, and (j) forming a metal film which will define a pixel electrode such that the contact hole is filled with the metal film.

The method may further include the step of (k) annealing the base steps for smoothing the base steps, the step (k) being to be carried out between the steps (g) and (h).

The interlayer insulating film may be formed of the same material as the material of which the base steps are formed, in the step (h).

The method may further include the step of annealing the metal film.

An active matrix substrate formed by the above-mentioned methods may be applied to a light-reflection type liquid crystal display device.

The advantages obtained by the aforementioned present invention will be described hereinbelow.

The active matrix substrate in accordance with the present invention is no longer necessary to include a gate insulating film having low quality and low reliability. Hence, the active matrix substrate in accordance with the present invention could present enhanced reliability in comparison with a conventional active matrix substrate including a thin film transistor.

In the active matrix substrate and the method of fabricating the same both in accordance with the present invention, there is not used a thin film such as an amorphous silicon film to be formed by PECVD which thin film is necessary, when formed, to produce a process temperature equal to or higher than a maximum resistance of a resin substrate to heat. Accordingly, the active matrix substrate and the method of fabricating the same both in accordance with the present invention make it possible to use a resin substrate in place of a glass substrate. The active matrix substrate including a resin substrate can be formed lighter and thinner than an active matrix substrate including a glass substrate. This ensures that a liquid crystal display device including the active matrix substrate can be formed lighter and thinner than a liquid crystal display device including a conventional active matrix substrate having a glass substrate.

The method of fabricating an active matrix substrate in accordance with the present invention makes it possible to reduce the number of photoresist steps in which photolithography and etching are carried out through the use of a photoresist film, in comparison with a conventional method of fabricating an active matrix substrate including a thin film transistor. Specifically, a conventional method of fabricating an active matrix substrate including a thin film transistor was necessary to carry out photoresist steps six or seven times. In contrast, the method of fabricating an active matrix substrate in accordance with the present invention carries out photoresist steps only five times.

In addition, the active matrix substrate in accordance with the present invention includes a resin substrate thinner than a glass substrate. Accordingly, it would be possible to reduce a height of the active matrix substrate in accordance with the present invention in comparison with an active matrix substrate including a glass substrate. Hence, it would be possible to reduce a height of a liquid crystal display device including the active matrix substrate in accordance with the present invention in comparison with a liquid crystal display device including a conventional active matrix substrate including a glass substrate.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 6A to 6G are cross-sectional views of the active matrix substrate in accordance with the first embodiment, illustrating respective steps of a method of fabricating the same.

DESCRIPTION OF THE PREFERRED EMBODIMENTS

Preferred embodiments in accordance with the present invention will be explained hereinbelow with reference to drawings.

First Embodiment

Figure 2:
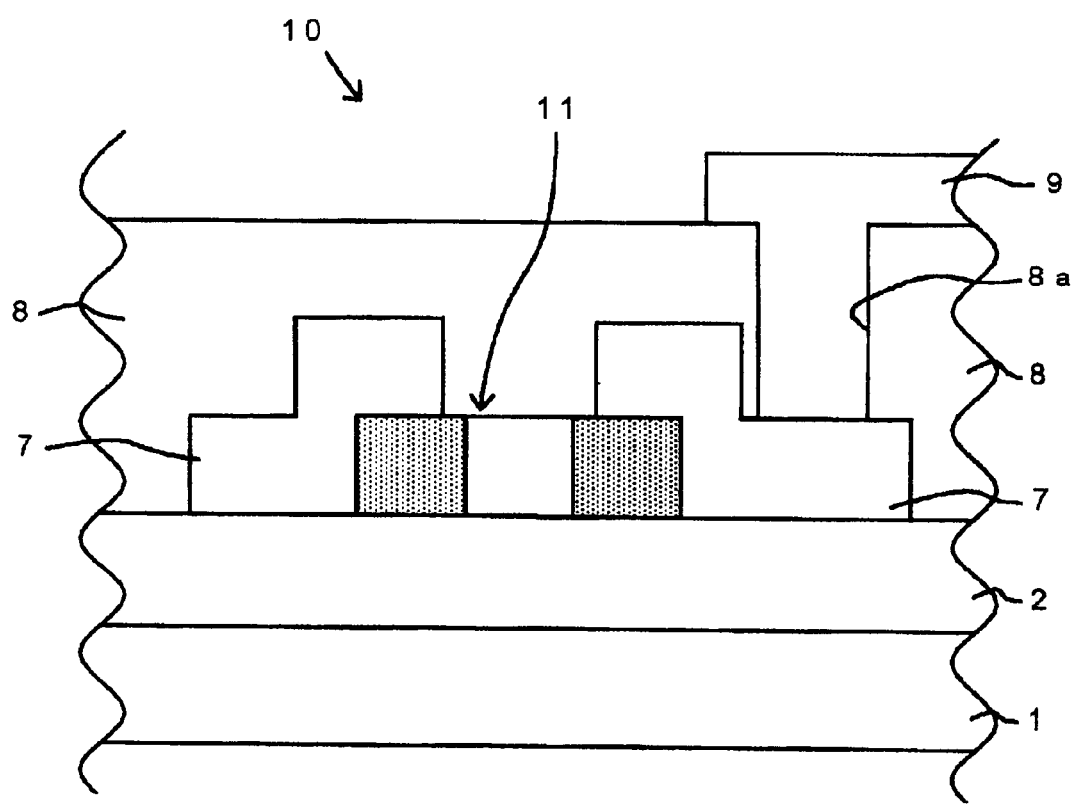
FIG. 2 is a cross-sectional view of an active matrix substrate in accordance with the first embodiment of the present invention.

FIG. 2 is a cross-sectional view of an active matrix substrate 10 in accordance with the first embodiment of the present invention.

The active matrix substrate 10 in accordance with the first embodiment is comprised of a substrate 1 composed of resin, a silicon dioxide film 2 formed as an electrically insulating film on the resin substrate 1, a diode 11 formed on the silicon dioxide film 2, a chromium (Cr) film 7 formed as a metal wiring film on the silicon dioxide film 2 such that the chromium film 7 makes electrical contact with the diode 11 at its opposite ends, an interlayer insulating film 8 covering the chromium film 7, the diode 11 and the silicon dioxide film 2 therewith, and an indium tin oxide (ITO) film 9 formed as a pixel electrode on the interlayer insulating film 8 and filling therewith a contact hole 8a formed through the interlayer insulating film 8 such that the contact hole 8a reaches the chromium film 7.

The resin substrate 1 is composed of polyethersulfon (PES).

The diode 11 is a lateral diode composed of polysilicon, and has nin or pip structure. It is preferable that the diode 11 has nin or pip structure, because a current-voltage (I-V) characteristic has to be symmetrical in driving a liquid crystal display device.

In the specification, the term "resin substrate" indicates all forms to which a diode can be formed, as well as a plate-shaped substrate. For instance, a resin film is covered by the term "resin substrate".

Figure 3:
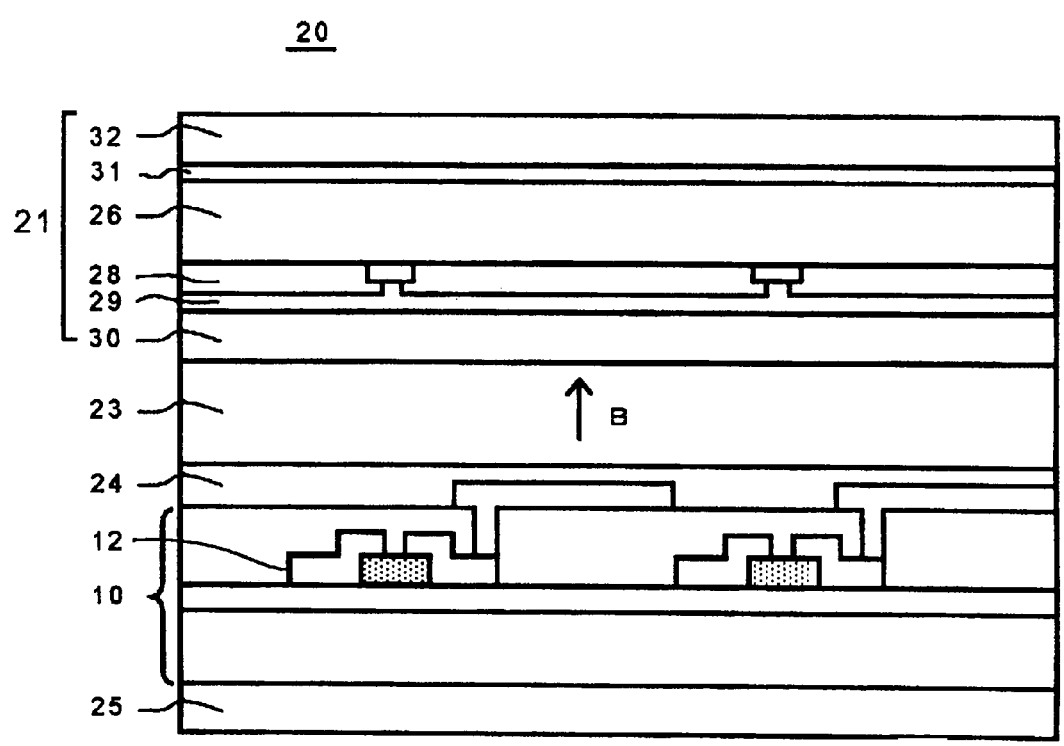
FIG. 3 is a cross-sectional view of a light-transmission type liquid crystal display device including the active matrix substrate in accordance with the first embodiment.

FIG. 3 is a cross-sectional view of a light-transmission type liquid crystal display device 20 including the active matrix substrate 10 in accordance with the first embodiment.

The light-transmission type liquid crystal display device 20 is comprised of the active matrix substrate 10, an opposite substrate 21 arranged in facing relation with the active matrix substrate 10, and a liquid crystal layer 23 sandwiched between the active matrix substrate 10 and the opposite substrate 21.

The active matrix substrate 10 further includes an alignment film 24 facing the liquid crystal layer 23, and a polarizer 25 formed on a bottom surface of the resin substrate 1.

The opposite substrate 21 is comprised of an electrically insulating transparent substrate 26, a black matrix layer 27 formed on the electrically insulating transparent substrate 26 as a light-shielding film, a color layer 28 formed on the electrically insulating transparent substrate 26, partially overlapping the black matrix layer 27, a transparent overcoat layer 29 covering the black matrix layer 27 and the color layer 28 therewith, an alignment film 30 formed on the overcoat layer 29, an electrically conductive layer 31 formed on a bottom surface of the electrically insulating transparent substrate 26, and a polarizer 32 covering the electrically conductive layer 31 therewith.

The electrically conductive layer 31 prevents electric charges caused by contact of a liquid crystal display panel with something, from electrically influencing the liquid crystal layer 23.

The color layer 28 is comprised of a resin film containing red (R), green (G) and blue (B) pigments therein.

The alignment films 24 and 30 are adhered to the active matrix substrate 10 and the opposite substrate 21 such that the alignment films 24 and 30 face each other, after rubbed such that the liquid crystal layer 23 is homogeneously aligned in a direction inclining by about 10 to about 30 degrees from a direction in which a pixel electrode extends.

In order to ensure a gap between the active matrix substrate 10 and the opposite substrate 21, spacers (not illustrated) are sandwiched therebetween, and the liquid crystal layer 23 is sealed at its periphery in order to prevent liquid crystal molecules from leaking out of the liquid crystal layer 23.

Figure 4:
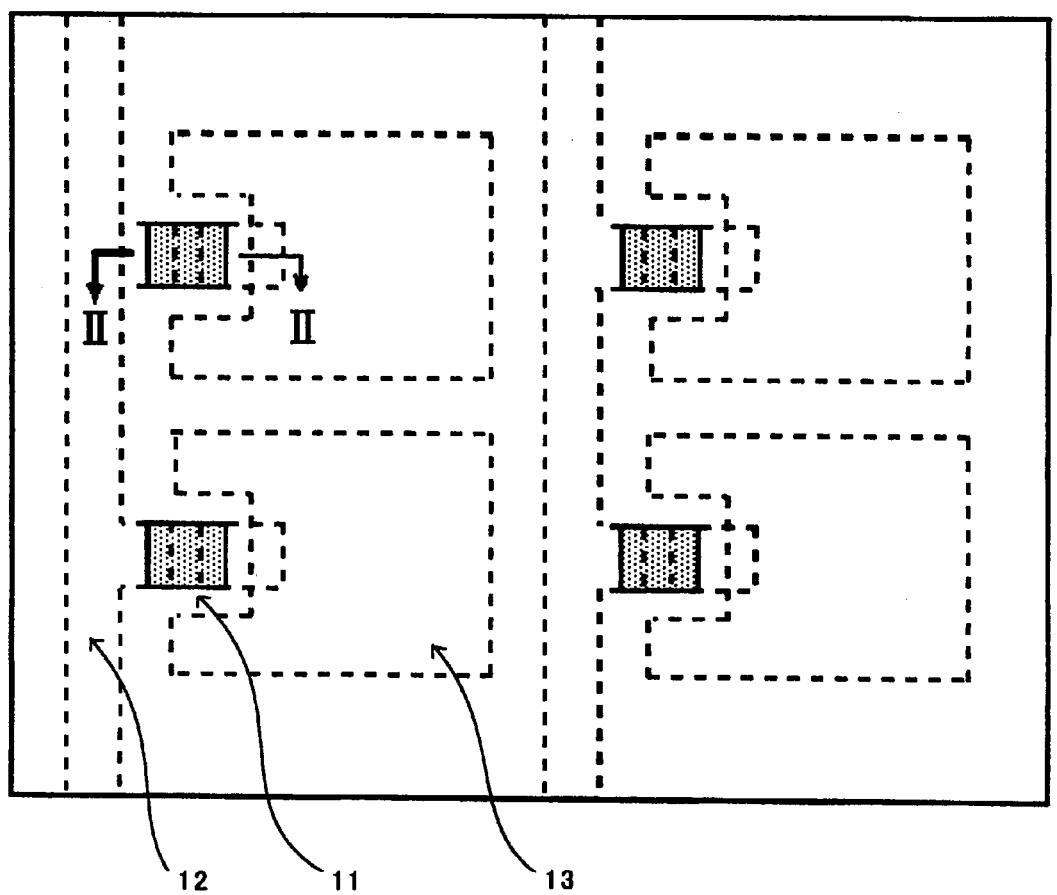
FIG. 4 is a plan view of the active matrix substrate in the light-transmission type liquid crystal display device illustrated in FIG. 3, when upwardly viewed.

FIG. 4 is a plan view of the active matrix substrate 10 viewed from the liquid crystal layer 23. FIG. 2 is a cross-sectional view taken along the line II—II in FIG. 4.

As illustrated in FIG. 4, the diodes 11 are arranged in matrix on the resin substrate 1. The chromium film 7 as a pixel electrode is formed in association with each of the diodes 11. The diodes 11 arranged in a column are electrically connected to one another through a scanning line 12 comprised of the chromium film 7 extending in a direction in which the column extends.

Figure 5:
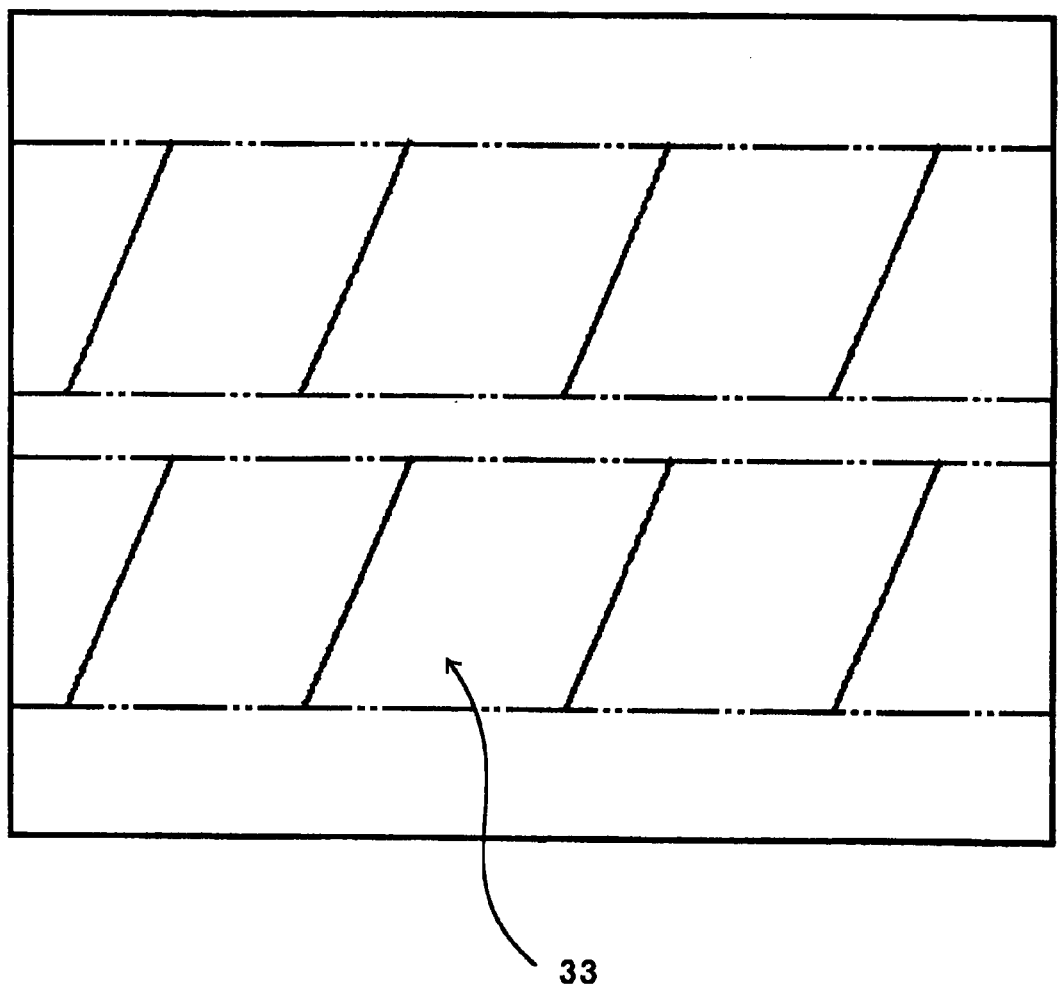
FIG. 5 is a plan view of an opposite substrate in the light-transmission type liquid crystal display device illustrated in FIG. 3, when upwardly viewed.

FIG. 5 is a plan view of the opposite substrate 21 viewed from the liquid crystal layer 23, that is, viewed in a direction indicated by an arrow B in FIG. 3.

As illustrated in FIG. 5, the opposite substrate 21 includes a plurality of signal lines 33 formed thereon extending in parallel to one another in a direction perpendicular to a direction in which the scanning line 12 extends.

The light-transmission type liquid crystal display device 20 may be driven in any way. For instance, the light-transmission type liquid crystal display device 20 may be driven in accordance with a conventional process. For instance, one of methods of driving such a light-transmission type liquid crystal display device is disclosed in S. Matsumoto, "Liquid Crystal Display Technique—Active Matrix LCD—", 1996, pp. 155–158.

Though the active matrix substrate 10 in accordance with the first embodiment is applied to the light-transmission type liquid crystal display device 20 in FIG. 3, the active matrix substrate 10 may be applied to a COT type liquid crystal display device.

Herein, a COT type liquid crystal display device indicates a liquid crystal display device in which a color filter, which corresponds to the color layer 28 illustrated in FIG. 3, is formed on a switching device. Herein, a switching device includes a thin film transistor and a diode. That is, "COT" means both "Color Filter on TFT (Thin Film Transistor)" and "Color Filter on TFD (Thin Film Diode)".

FIGS. 6A to 6G are cross-sectional views of the active matrix substrate 10 in accordance with the first embodiment, illustrating respective steps of a method of fabricating the same. Hereinbelow is explained a method of fabricating the active matrix substrate 10, with reference to FIGS. 6A to 6G.

As will be explained in each of the later mentioned steps, a temperature at which each of the steps is carried out is equal to or lower than a maximum resistance of the resin substrate 1 to heat.

First, as illustrated in FIG. 6A, the silicon dioxide film 2 is formed as a cover film by sputtering on the resin substrate 1 composed of polyethersulfon (PES) having a maximum resistance to heat of about 180 degrees centigrade. The silicon dioxide film 2 has a thickness of 6000 angstroms.

Then, the amorphous silicon (a-Si) film 3 is formed by sputtering on the resin substrate 1 so that the amorphous silicon film 3 has a thickness of 500 angstroms.

The conditions for forming the resin substrate 1 and the amorphous silicon film 3 by sputtering are as follows.

Radio frequency power: 4 kW
Pressure of argon gas: 5 mtorr
Temperature of the resin substrate 1: 150 degrees centigrade Then as illustrated in FIG. 6B, photoresist is coated all over the amorphous silicon film 3, and then, the photoresist is patterned by photolithography and etching to thereby form a mask 4.

Then, phosphorus (P) is doped into the amorphous silicon film 3 through the mask 4 by ion-doping technique. As a result, impurity-doped regions 5 into which n-type impurity is doped are formed in the amorphous silicon film 3 in selected regions.

The conditions for carrying out ion-doping are as follows.
Acceleration voltage: 20 KeV
Doped phosphorus: $2=10^{15}$ cm$^{-2}$ After removal of the mask 4, the amorphous silicon film 3 is crystallized into a polysilicon film 6 by excimer laser annealing, as illustrated in FIG. 6C. The impurity-doped regions 5 are simultaneously reformed into the polysilicon film 6 by the excimer laser annealing.

The conditions for carrying out the excimer laser annealing are as follows.
Light source: XeCl
Energy density: 350 mJ/cm$^2$
Beam diameter: 250×0.4 mm
Pitch of scanning radiation: 0.04 mm Then, the polysilicon film 6 is annealed for an hour at 150 degrees centigrade in hydrogen atmosphere.

Then, after photoresist has been coated over the polysilicon film 6, the photoresist is patterned by photolithography and dry etching to thereby form a mask. Then, the polysilicon film 6 is patterned by dry etching into an island through the mask, as illustrated in FIG. 6D.

Then, a chromium film which will make a metal wiring layer 7 is formed by sputtering, entirely covering the island-shaped polysilicon film 6 and the silicon dioxide film 2 therewith.

The conditions for forming the chromium film by sputtering are as follows.

Radio frequency power: 4 kW
Pressure of argon gas: 5 mtorr
Temperature of the resin substrate 1: 150 degrees centigrade Then, after photoresist has been coated on the chromium film, the photoresist is patterned by photolithography and dry etching to thereby form a mask. The chromium film is patterned through the thus formed mask to thereby form the metal wiring layer 7 such that the metal wiring layer 7 partially overlaps the island-shaped polysilicon film 6, as illustrated in FIG. 6E.

Then, as illustrated in FIG. 6F, a silicon dioxide film which will make the interlayer insulating film 8 is formed by sputtering entirely covering the silicon dioxide film 2, the metal wiring layer 7 and the polysilicon film 6 therewith.

The conditions for forming the silicon dioxide film by sputtering are as follows.

Radio frequency power: 4 kW
Pressure of argon gas: 5.2 mtorr
Temperature of the resin substrate 1: 150 degrees centigrade Then, after photoresist has been coated on the interlayer insulating film 8, the photoresist is patterned by photolithography and dry etching to thereby form a mask. Then, the interlayer insulating film 8 is formed therethrough with a contact hole 8a reaching the metal wiring layer 7 through the use of the mask.

Then, an electrically conductive transparent film such as an indium tin oxide (ITO) film is formed over the interlayer insulating film 8 by sputtering such that the contact hole 8a is filled with the interlayer insulating film 8.

The conditions for forming the electrically conductive transparent film by sputtering are as follows.

Radio frequency power: 4 kW
Pressure of argon gas: 5.5 mtorr
Temperature of the resin substrate 1: 155 degrees centigrade Then, after photoresist has been coated on the electrically conductive transparent film, the photoresist is patterned by photolithography and dry etching to thereby form a mask. Then, the electrically conductive transparent film is patterned through the thus formed mask to thereby form a pixel electrode 9, as illustrated in FIG. 6G.

Then, a product resulted from the above-mentioned steps is annealed for an hour at 150 degrees centigrade in order to reduce a contact resistance.

Through the above-mentioned steps, a polysilicon lateral diode having nin structure has been formed on the resin substrate 1. Since current-voltage (I-V) characteristic has to be symmetrical in driving a liquid crystal display device, it is preferable that the diode has nin structure.

As having been explained so far, the active matrix substrate 10 in accordance with the first embodiment is no longer necessary to include a gate insulating film having low quality and low reliability. Hence, the active matrix substrate 10 in accordance with the first embodiment could present enhanced performances and reliability in comparison with a conventional active matrix substrate including a thin film transistor.

In the active matrix substrate 10 in accordance with the first embodiment, there is not used a thin film such as an amorphous silicon film to be formed by PECVD which thin film is necessary, when formed, to produce a process temperature equal to or higher than a maximum resistance of the resin substrate 1 to heat (specifically, 180 degrees centigrade). Accordingly, the active matrix substrate 10 in accordance with the first embodiment make it possible to use the resin substrate 1 in place of a glass substrate. The active matrix substrate 10 including the resin substrate 1 can be formed lighter and thinner than a conventional active matrix substrate including a glass substrate. This ensures that a liquid crystal display device including the active matrix substrate 10 can be formed lighter and thinner than a liquid crystal display device including a conventional active matrix substrate having a glass substrate.

The method of fabricating the active matrix substrate 10 in accordance with the first embodiment makes it possible to reduce the number of photoresist steps in which photolithography and etching are carried out through the use of a patterned photoresist film, in comparison with a conventional method of fabricating an active matrix substrate including a thin film transistor. Specifically, a conventional method of fabricating an active matrix substrate including a thin film transistor was necessary to carry out photoresist steps six or seven times. In contrast, the method of fabricating the active matrix substrate 10 in accordance with the first embodiment carries out photoresist steps only five times.

In addition, the active matrix substrate 10 in accordance with the first embodiment includes the resin substrate 1 thinner than a glass substrate. Accordingly, it would be possible to reduce a height of the active matrix substrate 10 in accordance with the first embodiment in comparison with an active matrix substrate including a glass substrate. Hence, it would be possible to reduce a height of a liquid crystal display device including the active matrix substrate 10 in accordance with the first embodiment in comparison with a liquid crystal display device including a conventional active matrix substrate including a glass substrate.

Second Embodiment

Figure 7:
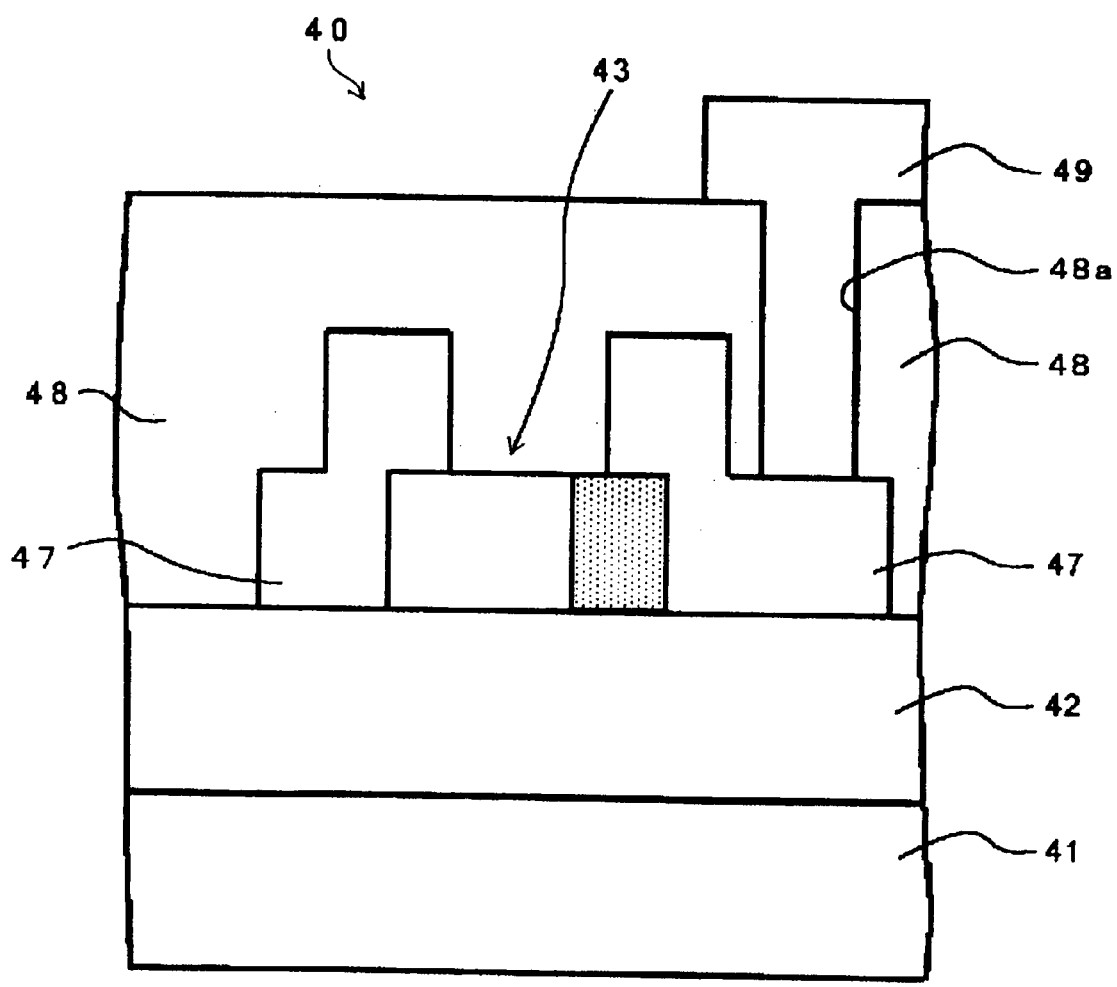
FIG. 7 is a cross-sectional view of an active matrix substrate in accordance with the second embodiment of the present invention.

FIG. 7 is a cross-sectional view of an active matrix substrate 40 in accordance with the second embodiment of the present invention.

The active matrix substrate 40 in accordance with the second embodiment is comprised of a substrate 41 composed of resin, a silicon dioxide film 42 formed as an electrically insulating film on the resin substrate 41, a diode 43 formed on the silicon dioxide film 42, a chromium (Cr) film 47 formed as a metal wiring film on the silicon dioxide film 42 such that the chromium film 47 makes electrical contact with the diode 43 at its opposite ends, an interlayer insulating film 48 covering the chromium film 47, the diode 43 and the silicon dioxide film 42 therewith, and an indium tin oxide (ITO) film 49 formed as a pixel electrode on the interlayer insulating film 48 and filling therewith a contact hole 48a formed through the interlayer insulating film 48 such that the contact hole 48a reaches the chromium film 47.

The resin substrate 41 is composed of polyimide (PI).

The diode 43 is a lateral diode composed of polysilicon, and has ni or pi structure. When a liquid crystal display device is driven by means of a diode having asymmetrical structure such as the diode 43, two diodes are electrically connected in ring to each other in order to ensure symmetry in current-voltage (I-V) characteristic.

Figure 8:
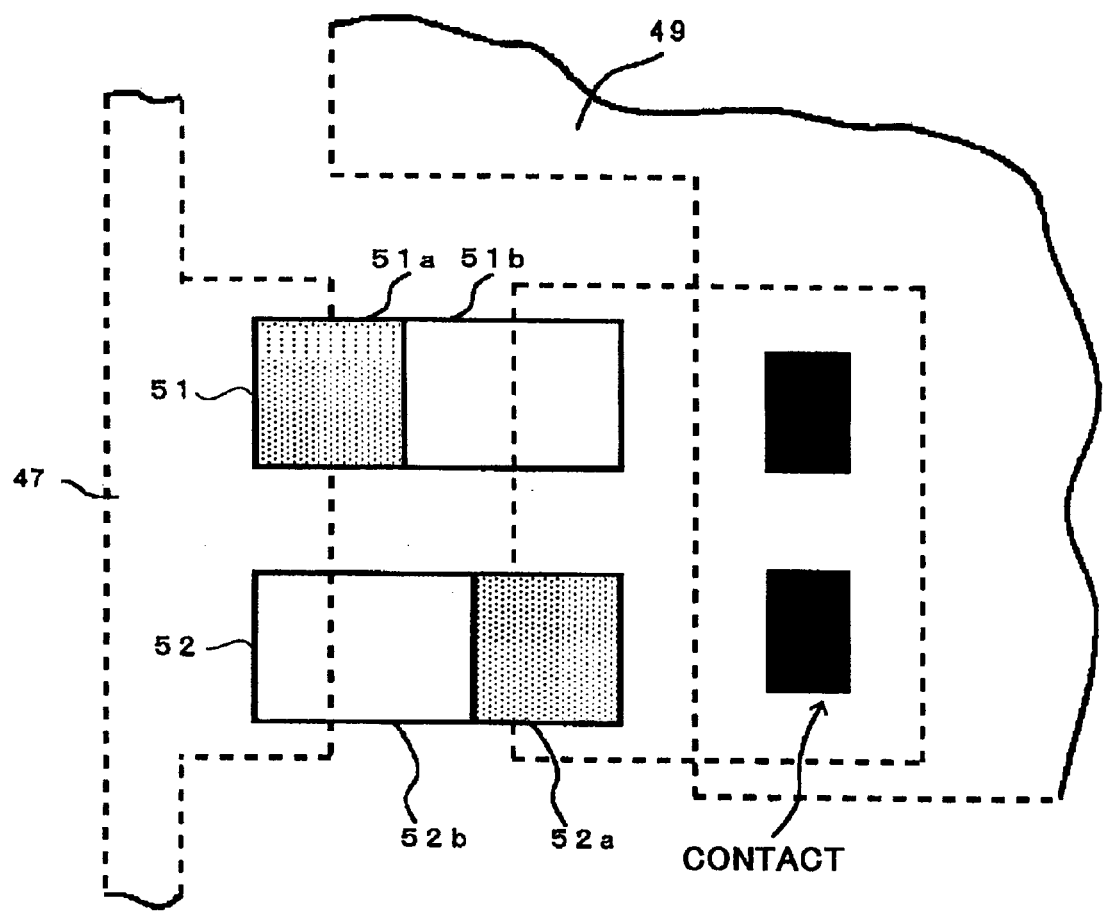
FIG. 8 is a plan view of a diode mounted on the active matrix substrate in accordance with the second embodiment, when upwardly viewed.

FIG. 8 illustrates an example of ring connection of diodes. In FIG. 8, two ni Schottky type polysilicon lateral diodes are electrically connected to each other in ring connection.

As illustrated in FIG. 8, two diodes are electrically connected in parallel and in opposite directions to each other in the ring connection of diodes. Specifically, in ring connection of diodes, a first diode 51 and a second diode 52 are arranged in such a way that an impurity-doped region 51a of the first diode 51 faces a polysilicon region 52b of the second diode 52, and a polysilicon region 51b of the first diode 51 faces an impurity-doped region 52a of the second diode 52.

Similarly to the active matrix substrate 10 in accordance with the first embodiment, the active matrix substrate 40 in accordance with the second embodiment may be applied to a light-transmission type liquid crystal display device illustrated in FIG. 3. The active matrix substrate 40 in accordance with the second embodiment may be applied to a COT type liquid crystal display device.

FIGS. 9A to 9G are cross-sectional views of the active matrix substrate 40 in accordance with the second embodiment, illustrating respective steps of a method of fabricating the same. Hereinbelow is explained a method of fabricating the active matrix substrate 40, with reference to FIGS. 9A to 9G.

As will be explained in each of the later mentioned steps, a temperature at which each of the steps is carried out is equal to or lower than a maximum resistance of the resin substrate 41 to heat.

Figure 9A:
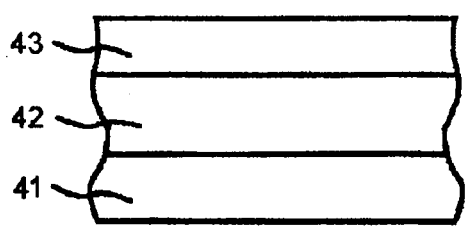
FIGS. 9A to 9G are cross-sectional views of the active matrix substrate in accordance with the second embodiment, illustrating respective steps of a method of fabricating the same.

First, as illustrated in FIG. 9A, the silicon dioxide film 42 is formed as a cover film by sputtering on the resin substrate 41 composed of polyimide (PI) having a maximum resistance to heat of about 220 degrees centigrade. The silicon dioxide film 42 has a thickness of 6000 angstroms.

Then, the amorphous silicon (a-Si) film 43 is formed by sputtering on the resin substrate 41 so that the amorphous silicon film 43 has a thickness of 500 angstroms.

Figure 9E:
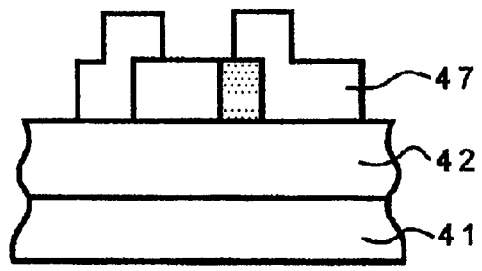
Figure 9B:
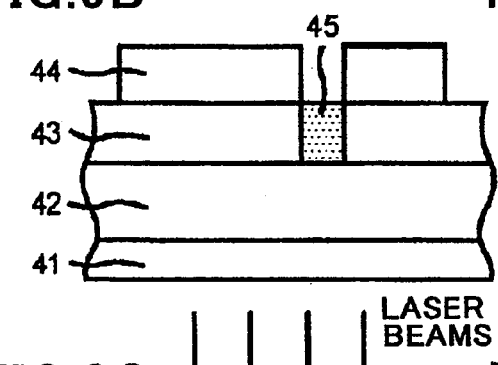

The conditions for forming the resin substrate 41 and the amorphous silicon film 43 by sputtering are as follows.
Radio frequency power: 4 kW
Pressure of argon gas: 5 mtorr
Temperature of the resin substrate 41: 150 degrees centigrade Then as illustrated in FIG. 9B, photoresist is coated all over the amorphous silicon film 43, and then, the photoresist is patterned by photolithography and etching to thereby form a mask 44.

Then, phosphorus (P) is doped into the amorphous silicon film 43 through the mask 44 by ion-doping technique. As a result, an impurity-doped region 45 into which n-type impurity is doped is formed in the amorphous silicon film 43 in a selected region.

The conditions for carrying out ion-doping are as follows.
Acceleration voltage: 20 KeV
Doped phosphorus: $2 \times 10^{15}$ cm$^{-2}$ After removal of the mask 44, the amorphous silicon film 43 is crystallized into a polysilicon film 46 by excimer laser annealing, as illustrated in FIG. 9C. The impurity-doped region 45 is simultaneously reformed into the polysilicon film 46 by the excimer laser annealing.

The conditions for carrying out the excimer laser annealing are as follows.
Light source: XeCl
Energy density: 350 mJ/cm$^2$
Beam diameter: 250×0.4 mm
Pitch of scanning radiation: 0.04 mm Then, hydrogen plasma is applied to the polysilicon film 46.

The conditions for applying hydrogen plasma to the polysilicon film 46 are as follows.
Discharge power: 300 W
Pressure of hydrogen gas: 1 torr
Temperature of the resin substrate 41: 200 degrees centigrade Then, after photoresist has been coated over the polysilicon film 46, the photoresist is patterned by photolithography and dry etching to thereby form a mask. Then, the polysilicon film 46 is patterned by dry etching into an island through the mask, as illustrated in FIG. 9D.

Then, a chromium film which will make the metal wiring layer 47 is formed by sputtering, entirely covering the island-shaped polysilicon film 46 and the silicon dioxide film 42 therewith.

The conditions for forming the chromium film by sputtering are as follows.
Radio frequency power: 4 kW
Pressure of argon gas: 5 mtorr
Temperature of the resin substrate 41: 150 degrees centigrade Then, after photoresist has been coated on the chromium film, the photoresist is patterned by photolithography and dry etching to thereby form a mask. The chromium film is patterned through the thus formed mask to thereby form the metal wiring layer 47 such that the metal wiring layer 47 partially overlaps the island-shaped polysilicon film 46, as illustrated in FIG. 9E.

Figure 9F:
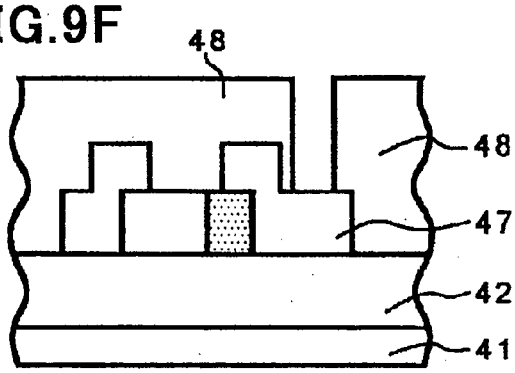
Figure 9C:
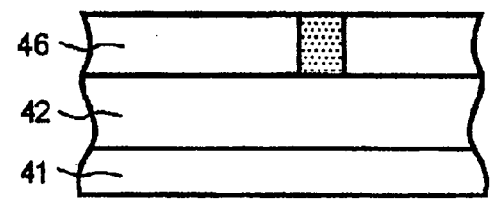

Then, as illustrated in FIG. 9F, a silicon dioxide film which will make the interlayer insulating film 48 is formed by sputtering entirely covering the silicon dioxide film 42, the metal wiring layer 47 and the polysilicon film 46 therewith.

The conditions for forming the silicon dioxide film by sputtering are as follows.
Radio frequency power: 4 kW
Pressure of argon gas: 5 mtorr
Temperature of the resin substrate 41: 150 degrees centigrade Then, after photoresist has been coated on the interlayer insulating film 48, the photoresist is patterned by photolithography and dry etching to thereby form a mask. Then, the interlayer insulating film 48 is formed therethrough with a contact hole 48a reaching the metal wiring layer 47, through the use of the mask.

Then, an electrically conductive transparent film such as an indium tin oxide (ITO) film is formed over the interlayer insulating film 48 by sputtering such that the contact hole 48a is filled with the interlayer insulating film 48.

Figure 9G:
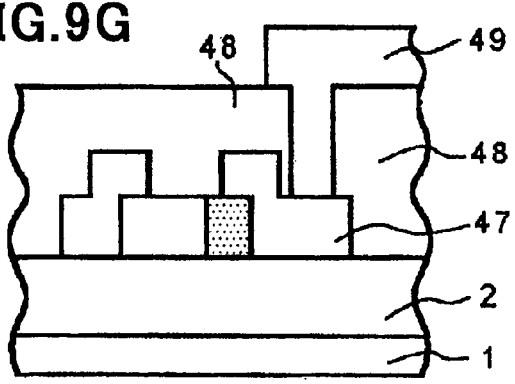
Figure 9D:
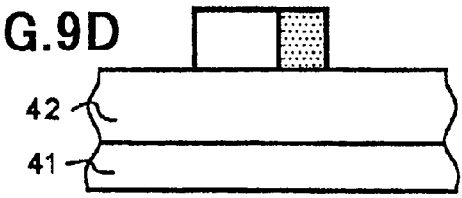

The conditions for forming the electrically conductive transparent film by sputtering are as follows.
Radio frequency power: 4 kW
Pressure of argon gas: 5 mtorr
Temperature of the resin substrate 41: 150 degrees centigrade Then, after photoresist has been coated on the electrically conductive transparent film, the photoresist is patterned by photolithography and dry etching to thereby form a mask. Then, the electrically conductive transparent film is patterned through the thus formed mask to thereby form a pixel electrode 9, as illustrated in FIG. 9G.

Then, a product resulted from the above-mentioned steps is annealed for an hour at 200 degrees centigrade in order to reduce a contact resistance.

Through the above-mentioned steps, a polysilicon lateral diode having ni structure has been formed on the resin substrate 41.

The active matrix substrate 40 in accordance with the second embodiment provides the same advantages as the advantages obtained by the active matrix substrate 10 in accordance with the first embodiment.

Third Embodiment

Figure 10:
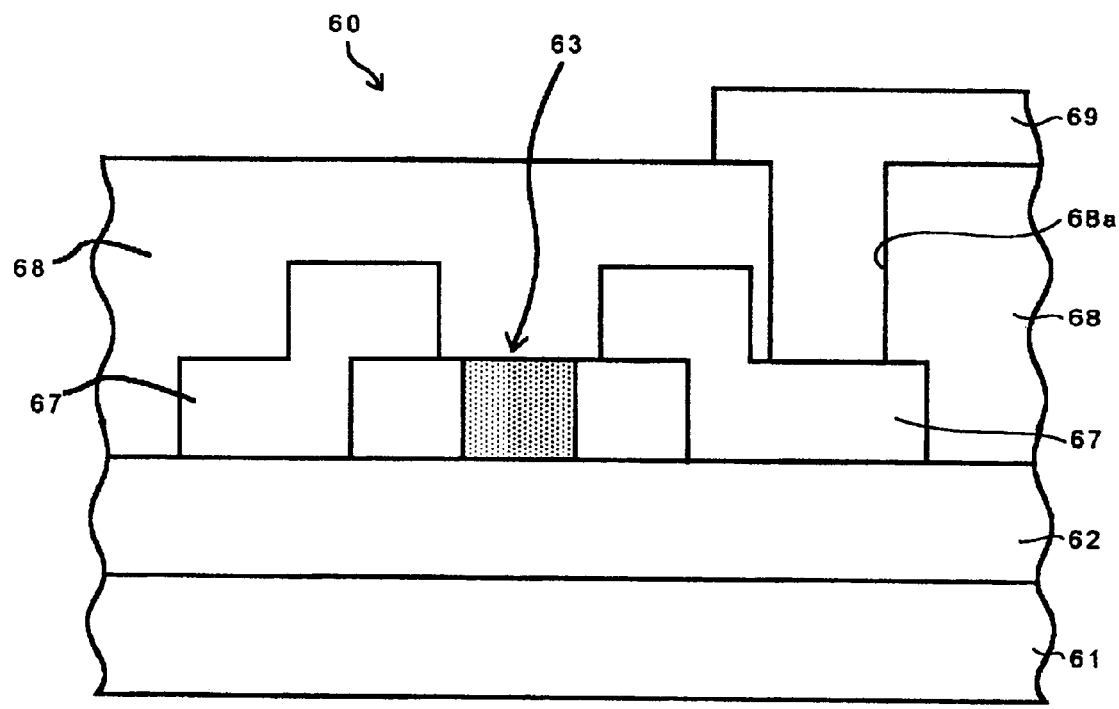
FIG. 10 is a cross-sectional view of an active matrix substrate in accordance with the third embodiment of the present invention.

FIG. 10 is a cross-sectional view of an active matrix substrate 60 in accordance with the third embodiment of the present invention.

The active matrix substrate 60 in accordance with the third embodiment is comprised of a substrate 61 composed of resin, a silicon dioxide film 62 formed as an electrically insulating film on the resin substrate 61, a diode 63 formed on the silicon dioxide film 62, a chromium (Cr) film 67 formed as a metal wiring film on the silicon dioxide film 62 such that the chromium film 67 makes electrical contact with the diode 63 at its opposite ends, an interlayer insulating film 68 covering the chromium film 67, the diode 63 and the silicon dioxide film 62 therewith, and an indium tin oxide (ITO) film 69 formed as a pixel electrode on the interlayer insulating film 68 and filling therewith a contact hole 68a formed through the interlayer insulating film 68 such that the contact hole 68a reaches the chromium film 67.

The resin substrate 61 is composed of polycarbonate (PC).

The diode 63 is a lateral diode composed of polysilicon, and has ini or ipi structure. Ini or ipi structure in a lateral diode corresponds to a so-called back-to-back structure in which ni or pi Schottky structures in a vertical diode are electrically connected to each other in opposite directions, and has high symmetry in I-V characteristic.

Similarly to the active matrix substrate 10 in accordance with the first embodiment, the active matrix substrate 60 in accordance with the third embodiment may be applied to a light-transmission type liquid crystal display device illustrated in FIG. 3. The active matrix substrate 60 in accordance with the third embodiment may be applied to a COT type liquid crystal display device.

FIGS. 11A to 11G are cross-sectional views of the active matrix substrate 60 in accordance with the third embodiment, illustrating respective steps of a method of fabricating the same. Hereinbelow is explained a method of fabricating the active matrix substrate 60, with reference to FIGS. 11A to 11G.

As will be explained in each of the later mentioned steps, a temperature at which each of the steps is carried out is equal to or lower than a maximum resistance of the resin substrate 61 to heat.

Figure 11A:
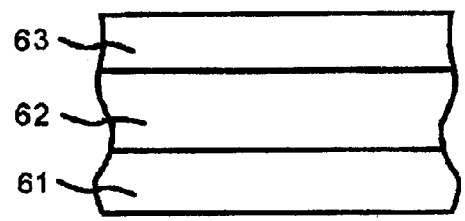
FIGS. 11A to 11G are cross-sectional views of the active matrix substrate in accordance with the third embodiment, illustrating respective steps of a method of fabricating the same.

First, as illustrated in FIG. 11A, the silicon dioxide film 62 is formed as a cover film by sputtering on the resin substrate 61 composed of polycarbonate (PC) having a maximum resistance to heat of about 130 degrees centigrade. The silicon dioxide film 62 has a thickness of 6000 angstroms.

Then, the amorphous silicon (a-Si) film 63 is formed by sputtering on the resin substrate 61 so that the amorphous silicon film 63 has a thickness of 500 angstroms.

The conditions for forming the resin substrate 61 and the amorphous silicon film 63 by sputtering are as follows.

Figure 11E:
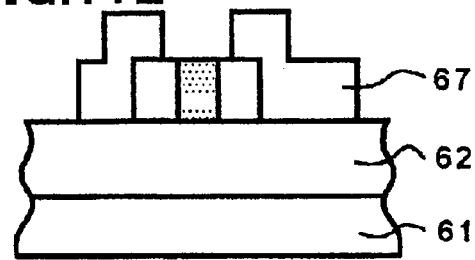
Figure 11B:
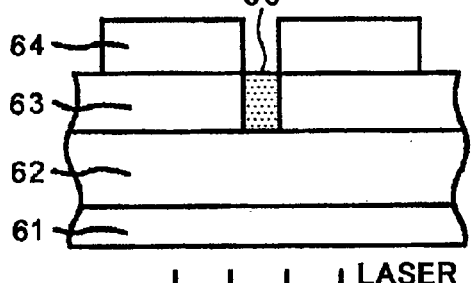

Radio frequency power: 4 kW
Pressure of argon gas: 5 mtorr
Temperature of the resin substrate 61: 150 degrees centigrade Then as illustrated in FIG. 11B, photoresist is coated all over the amorphous silicon film 63, and then, the photoresist is patterned by photolithography and etching to thereby form a mask 64.

Then, phosphorus (P) is doped into the amorphous silicon film 63 through the mask 64 by ion-doping technique. As a result, an impurity-doped region 65 into which n-type impurity is doped is formed in the amorphous silicon film 63 in a selected region.

The conditions for carrying out ion-doping are as follows.

Acceleration voltage: 20 KeV
Doped phosphorus: $2 \times 10^{15}$ cm$^{-2}$

Figure 11F:
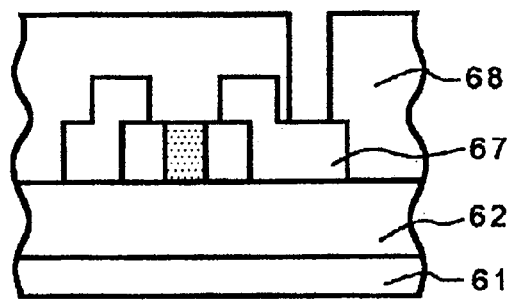
Figure 11C:
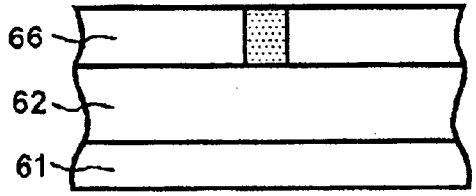

After removal of the mask 64, the amorphous silicon film 63 is crystallized into a polysilicon film 66 by excimer laser annealing, as illustrated in FIG. 11C. The impurity-doped region 65 is simultaneously reformed into the polysilicon film 66 by the excimer laser annealing.

The conditions for carrying out the excimer laser annealing are as follows.

Light source: XeCl
Energy density: 350 mJ/cm$^2$
Beam diameter: 250×0.4 mm
Pitch of scanning radiation: 0.04 mm Then, hydrogen plasma is applied to the polysilicon film 66.

The conditions for applying hydrogen plasma to the polysilicon film 66 are as follows.

Figure 11G:
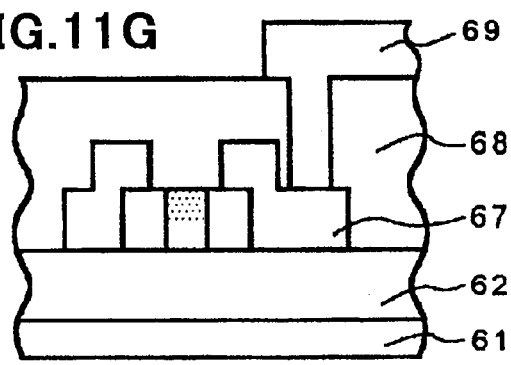
Figure 11D:
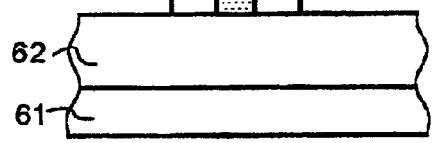

Discharge power: 300 W
Pressure of hydrogen gas: 1 torr
Temperature of the resin substrate 61: 100 degrees centigrade Then, after photoresist has been coated over the polysilicon film 66, the photoresist is patterned by photolithography and dry etching to thereby form a mask. Then, the polysilicon film 66 is patterned by dry etching into an island through the mask, as illustrated in FIG. 11D.

Then, a chromium film which will make the metal wiring layer 67 is formed by sputtering, entirely covering the island-shaped polysilicon film 66 and the silicon dioxide film 62 therewith.

The conditions for forming the chromium film by sputtering are as follows.

Radio frequency power: 4 kW
Pressure of argon gas: 5 mtorr
Temperature of the resin substrate 61: 150 degrees centigrade Then, after photoresist has been coated on the chromium film, the photoresist is patterned by photolithography and dry etching to thereby form a mask. The chromium film is patterned through the thus formed mask to thereby form the metal wiring layer 67 such that the metal wiring layer 67 partially overlaps the island-shaped polysilicon film 66, as illustrated in FIG. 11E.

Figure 1:
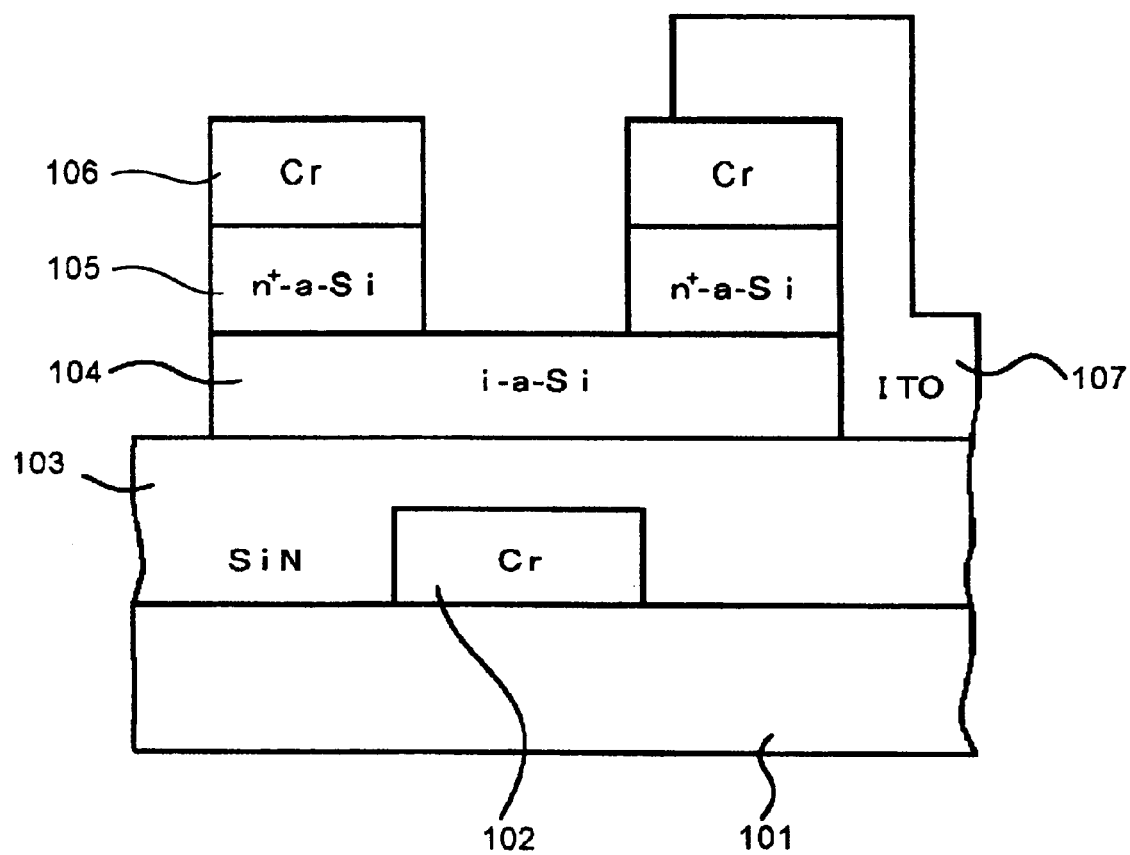
FIG. 1 is a cross-sectional view of a conventional active matrix substrate.

Then, as illustrated in FIG. 1F, a silicon dioxide film which will make the interlayer insulating film 68 is formed by sputtering entirely covering the silicon dioxide film 62, the metal wiring layer 67 and the polysilicon film 66 therewith.

The conditions for forming the silicon dioxide film by sputtering are as follows.

Radio frequency power: 4 kW
Pressure of argon gas: 5 mtorr

Temperature of the resin substrate 61: 150 degrees centigrade

Then, after photoresist has been coated on the interlayer insulating film 68, the photoresist is patterned by photolithography and dry etching to thereby form a mask. Then, the interlayer insulating film 68 is formed therethrough with a contact hole 68a reaching the metal wiring layer 67, through the use of the mask.

Then, an electrically conductive transparent film such as an indium tin oxide (ITO) film is formed over the interlayer insulating film 68 by sputtering such that the contact hole 68a is filled with the interlayer insulating film 68.

The conditions for forming the electrically conductive transparent film by sputtering are as follows.

Radio frequency power: 4 kW
Pressure of argon gas: 5 mtorr
Temperature of the resin substrate 61: 150 degrees centigrade Then, after photoresist has been coated on the electrically conductive transparent film, the photoresist is patterned by photolithography and dry etching to thereby form a mask. Then, the electrically conductive transparent film is patterned through the thus formed mask to thereby form a pixel electrode 69, as illustrated in FIG. 11G.

Then, a product resulted from the above-mentioned steps is annealed for an hour at 130 degrees centigrade in order to reduce a contact resistance.

Through the above-mentioned steps, a polysilicon lateral diode having ini structure has been formed on the resin substrate 61.

The active matrix substrate 60 in accordance with the third embodiment provides the same advantages as the advantages obtained by the active matrix substrate 10 in accordance with the first embodiment.

Fourth Embodiment

Figure 12:
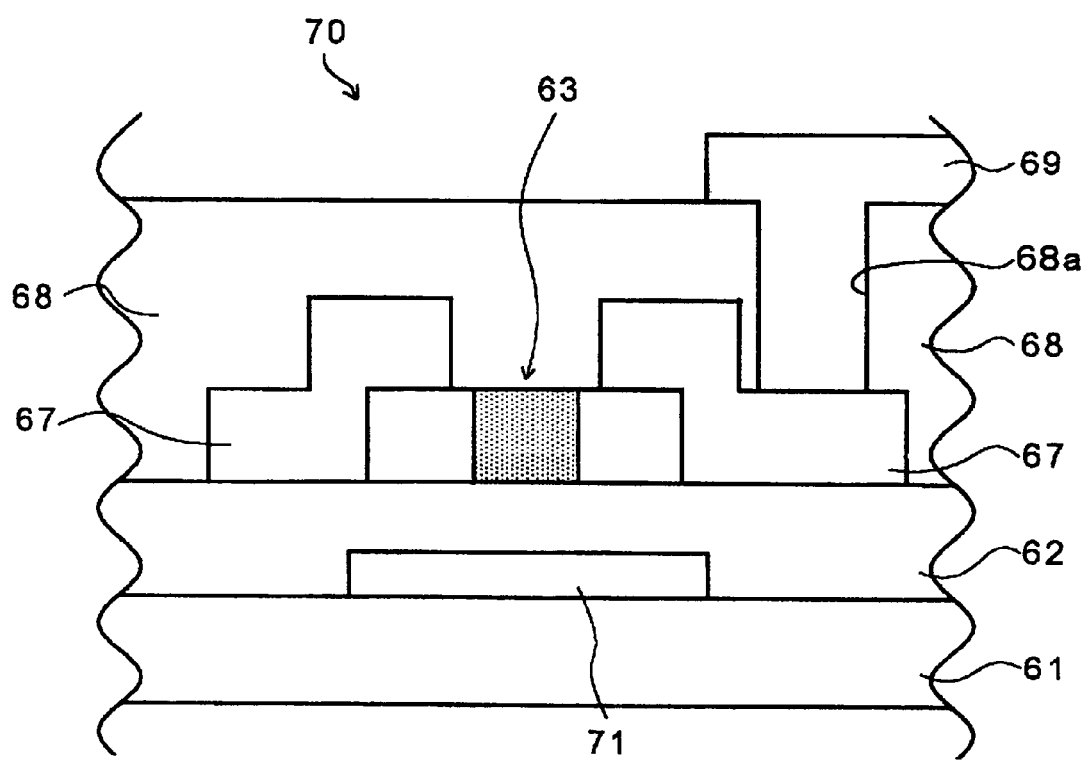
FIG. 12 is a cross-sectional view of an active matrix substrate in accordance with the fourth embodiment of the present invention.

FIG. 12 is a cross-sectional view of an active matrix substrate 70 in accordance with the fourth embodiment of the present invention.

The active matrix substrate 70 in accordance with the fourth embodiment is comprised of a substrate 61 composed of resin, a light-shielding film 71 comprised of a chromium film formed on the resin substrate 61, a silicon dioxide film 62 formed as an electrically insulating film on the resin substrate 61, covering the light-shielding film 71 therewith, a diode 63 formed on the silicon dioxide film 62, a chromium (Cr) film 67 formed as a metal wiring film on the silicon dioxide film 62 such that the chromium film 67 makes electrical contact with the diode 63 at its opposite ends, an interlayer insulating film 68 covering the chromium film 67, the diode 63 and the silicon dioxide film 62 therewith, and an indium tin oxide (ITO) film 69 formed as a pixel electrode on the interlayer insulating film 68 and filling therewith a contact hole 68a formed through the interlayer insulating film 68 such that the contact hole 68a reaches the chromium film 67.

In comparison with the active matrix substrate 60 in accordance with the third embodiment, the active matrix substrate 70 in accordance with the fourth embodiment further includes the light-shielding film 71. The active matrix substrate 70 has the same structure as the structure of the active matrix substrate 60 except additionally having the light-shielding film 71.

The active matrix substrate 70 in accordance with the fourth embodiment provides the same advantages as the advantages obtained by the active matrix substrate 60 in accordance with the third embodiment. In addition, since the active matrix substrate 70 further includes the light-shielding film 71, the active matrix substrate 70 would make it possible to prevent malfunction of a lateral diode having no lower electrode, caused by backlight in a light-transmission type liquid crystal display device.

Similarly to the active matrix substrate 10 in accordance with the first embodiment, the active matrix substrate 70 in accordance with the fourth embodiment may be applied to a light-transmission type liquid crystal display device illustrated in FIG. 3. The active matrix substrate 70 in accordance with the fourth embodiment may be applied to a COT type liquid crystal display device.

A method of fabricating the active matrix substrate 70 in accordance with the fourth embodiment has the same steps as the steps to be carried out in the method of fabricating the active matrix substrate 60 in accordance with the third embodiment, except a step of forming the light-shielding film 71.

Specifically, in a method of fabricating the active matrix substrate 70 in accordance with the fourth embodiment, a chromium film which will make the light-shielding film 71 is first formed on the resin substrate 61 by sputtering. The chromium film has a thickness of 1500 angstroms.

Then, after photoresist has been coated on the chromium film, the photoresist is patterned by photolithography and dry etching to thereby form a mask. Then, the chromium film is patterned through the thus formed mask to thereby form the light-shielding film 71.

Then, the steps having been explained with reference to FIGS. 11B to 11G are carried out.

Through the above-mentioned steps, a polysilicon lateral diode having ini structure has been formed on the resin substrate 61.

Fifth Embodiment

Figure 13:
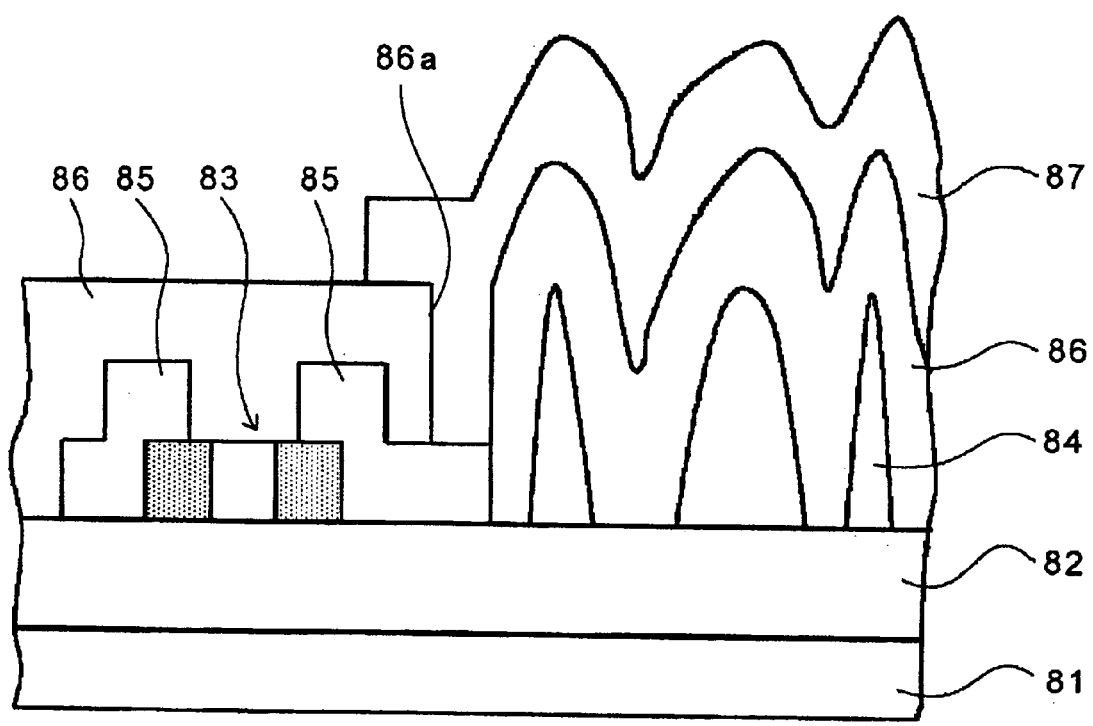
FIG. 13 is a cross-sectional view of an active matrix substrate in accordance with the fifth embodiment of the present invention.

FIG. 13 is a cross-sectional view of an active matrix substrate 80 in accordance with the fifth embodiment of the present invention.

The active matrix substrate 80 in accordance with the fifth embodiment is comprised of a substrate 81 composed of resin, a silicon dioxide film 82 formed as an electrically insulating film on the resin substrate 81, a diode 83 formed on the silicon dioxide film 82, base steps 84 formed on the silicon dioxide film 82 in a region in which a pixel is to be formed, a chromium (Cr) film 85 formed as a metal wiring film on the silicon dioxide film 82 such that the chromium film 85 makes electrical contact with the diode 83 at its opposite ends, an interlayer insulating film 86 covering the chromium film 85, the diode 83, the silicon dioxide film 82 and the base steps 84 therewith, and an indium tin oxide (ITO) film 87 formed as a pixel electrode on the interlayer insulating film 86 and filling therewith a contact hole 86a formed through the interlayer insulating film 86 such that the contact hole 86a reaches the chromium film 85.

The resin substrate 81 is composed of siloxane.

The diode 83 is a lateral diode composed of polysilicon, and has ini or ipi structure.

Since a resin substrate generally has greater optical anisotropy than that of a glass substrate, it is preferable for a resin substrate to be used in a light-reflection type liquid crystal display device including only one substrate in optical path, with respect to display quality.

In addition, since light is not directly radiated to the diode 83 in a light-reflection type liquid crystal display device, it is not necessary for the active matrix substrate 80 to include the light-shielding film 71 illustrated in FIG. 12.

Figure 14:
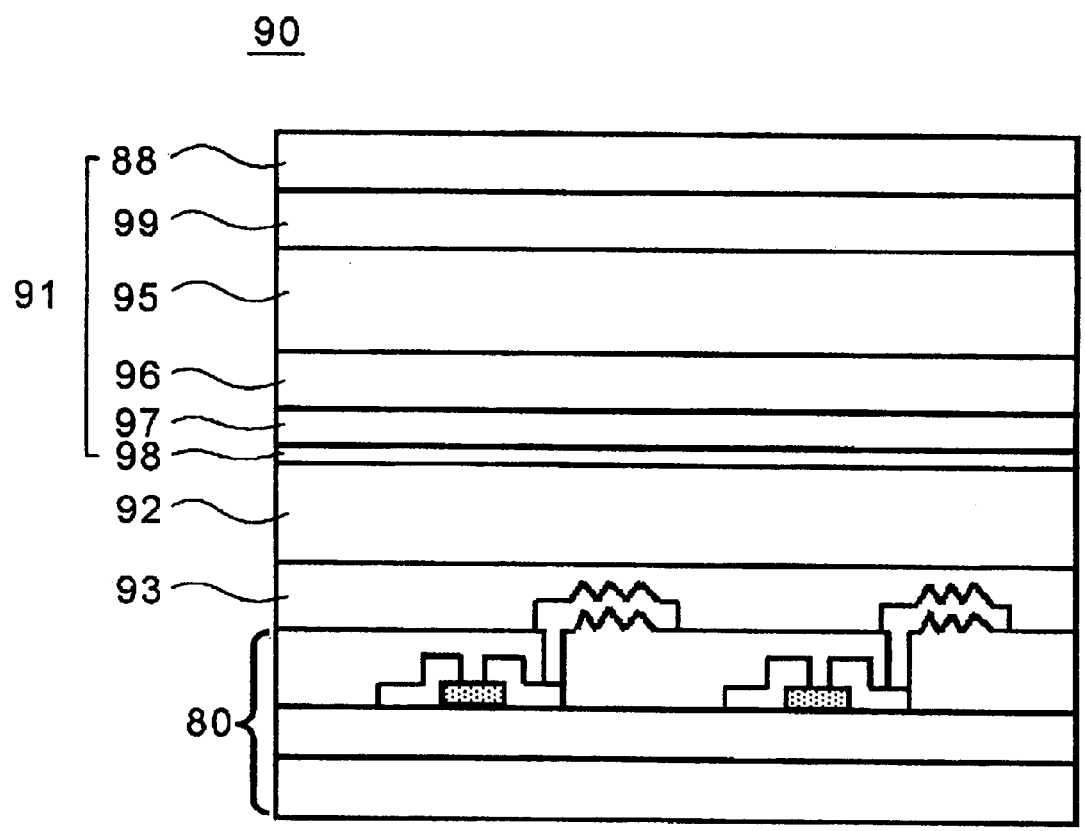
FIG. 14 is a cross-sectional view of a light-reflection type liquid crystal display device including the active matrix substrate in accordance with the fifth embodiment.

FIG. 14 is a cross-sectional view of a light-reflection type liquid crystal display device 90 including the active matrix substrate 80 in accordance with the fifth embodiment.

The light-reflection type liquid crystal display device 90 is comprised of the active matrix substrate 80, an opposite substrate 91 arranged in facing relation with the active matrix substrate 80, and a liquid crystal layer 92 sandwiched between the active matrix substrate 80 and the opposite substrate 91.

The active matrix substrate 80 further includes an alignment film 93 facing the liquid crystal layer 92.

The opposite substrate 91 is comprised of an electrically insulating transparent substrate 95, a color layer 96 formed on the electrically insulating transparent substrate 95, a transparent overcoat layer 97 covering the color layer 96 therewith, an alignment film 98 formed on the overcoat layer 97, a phase retardation plate 99 formed on the electrically insulating transparent substrate 95 at the opposite side of the liquid crystal layer 92, and a polarizer 88 formed on the phase retardation plate 99.

FIGS. 15A to 15E are cross-sectional views of the active matrix substrate 80 in accordance with the fifth embodiment, illustrating respective steps of a method of fabricating the same. Hereinbelow is explained a method of fabricating the active matrix substrate 80, with reference to FIGS. 15A to 15E.

As will be explained in each of the later mentioned steps, a temperature at which each of the steps is carried out is equal to or lower than a maximum resistance of the resin substrate 81 to heat.

Figure 15A:
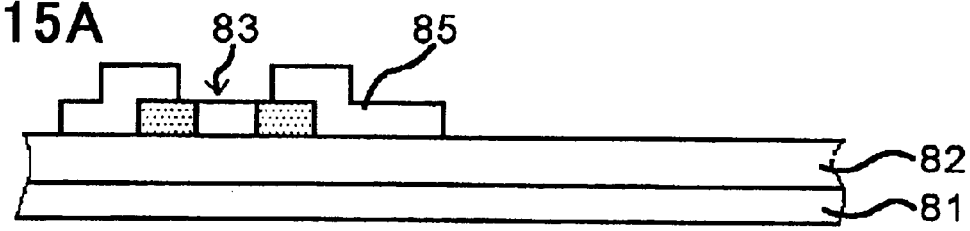
FIGS. 15A to 15E are cross-sectional views of the active matrix substrate in accordance with the fifth embodiment, illustrating respective steps of a method of fabricating the same.

First, as illustrated in FIG. 15A, the diode 83 and the metal wiring layer 85 are formed on the resin substrate 81 composed of siloxane having a maximum resistance of 250 degrees centigrade to heat, in the same way as the first embodiment.

Figure 15B:
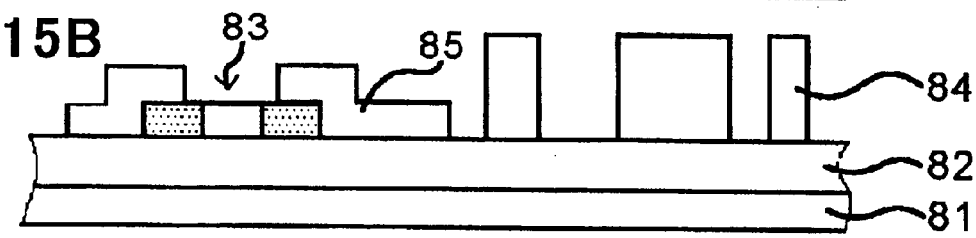

Then, as illustrated in FIG. 15B, a photosensitive organic film is formed on the silicon dioxide film 82. The photosensitive organic film is patterned by exposing to light and developing, to thereby the base steps 84 in a region in which a pixel is to be formed.

Then, if necessary, the base steps 84 are tightened by baking at 100 degrees centigrade.

Figure 15C:
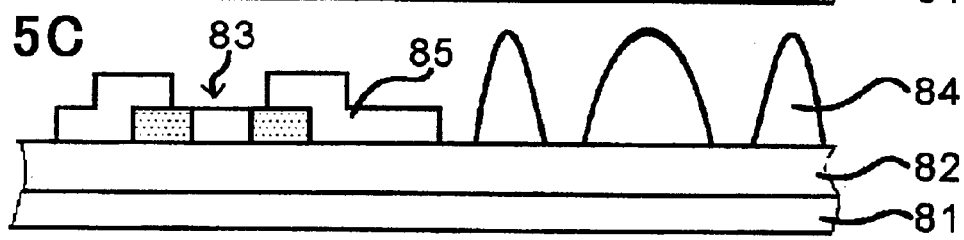

Then, as illustrated in FIG. 15C, the base steps 84 are annealed for an hour at 200 degrees centigrade to thereby smooth or round the base steps 84.

Figure 15D:
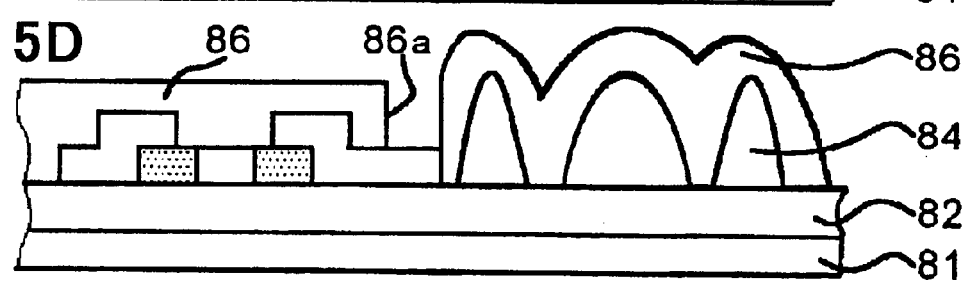

Then, as illustrated in FIG. 15D, an organic film which will make the interlayer insulating film 86 is formed entirely covering the diode 83, the metal wiring layer 85, the base steps 84 and the silicon dioxide film 82 therewith.

Then, after photoresist has been coated on the organic film, the photoresist is patterned by photolithography and dry etching to thereby form a mask. Then, the interlayer insulating film 86 is formed therethrough with a contact hole 86a reaching the metal wiring layer 85, through the use of the mask.

Then, an aluminum film 87 is formed over the interlayer insulating film 86 by sputtering such that the contact hole 86a is filled with the aluminum film 87.

The conditions for forming the aluminum film 87 by sputtering are as follows.

Figure 15E:
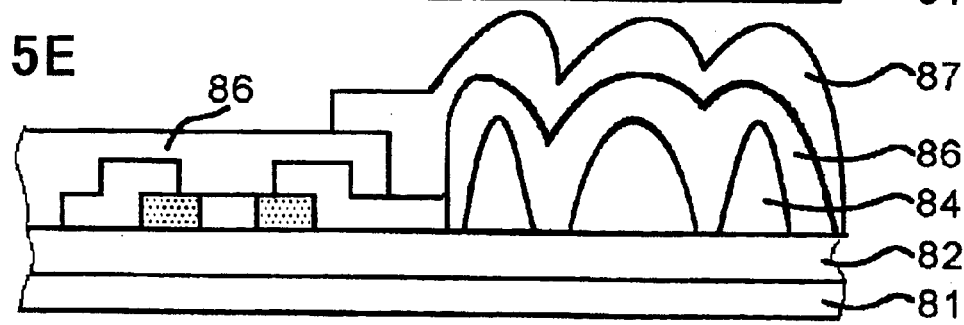

Radio frequency power: 4 kW
Pressure of argon gas: 5 mtorr
Temperature of the resin substrate 61: 170 degrees centigrade Then, after photoresist has been coated on the aluminum film 87, the photoresist is patterned by photolithography and dry etching to thereby form a mask. Then, the aluminum film 87 is patterned through the thus formed mask to thereby form a pixel electrode 87, as illustrated in FIG. 15E.

Then, a product resulted from the above-mentioned steps is annealed for an hour at 150 degrees centigrade in order to reduce a contact resistance.

Through the above-mentioned steps, a polysilicon lateral diode having ini structure has been formed on the resin substrate 81.

As mentioned earlier, the active matrix substrate 80 in accordance with the fifth embodiment is suitable to a light-reflection type liquid crystal display device.

The active matrix substrate 80 in accordance with the fifth embodiment provides the same advantages as the advantages obtained by the active matrix substrate 10 in accordance with the first embodiment.

In the above-mentioned first to fifth embodiments, only parts by which the present invention is characterized have been explained, and parts known to those skilled in the art were not explained in detail. However, it should be noted that even if they are not explained in detail, those skilled in the art could understand them readily.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-104570 filed on Apr. 3, 2001 including specification, claims, drawings and summary is incorporated herein by reference in its entirety.

What is claimed is:

1. A method of fabricating an active matrix substrate, comprising the steps of:
   (a) forming an amorphous silicon film on a substrate composed of resin;
   (b) doping impurity into said amorphous silicon film in a selected region thereof;
   (c) radiating laser beams to said amorphous silicon film for crystallizing said amorphous silicon film into a polysilicon film; and
   (d) patterning said polysilicon film into an island to thereby form a diode.

2. The method as set forth in claim 1, wherein said diode comprises a lateral diode.

3. A method of fabricating an active matrix substrate, comprising the steps of:
   (a) forming an electrically insulating film on a substrate composed of resin;
   (b) forming a diode on said electrically insulating film by;
      (1) forming an amorphous silicon film on said electrically insulating film;
      (2) doping impurity into said amorphous silicon film in a selected region thereof;
      (3) radiating laser beams to said amorphous silicon film for crystallizing said amorphous silicon film into a polysilicon film; and
      (4) patterning said polysilicon film into an island;
   (c) forming a metal wiring such that said metal wire makes electrical contact with said island-shaped polysilicon film;

(d) forming an interlayer insulating film all over a product resulting from said step (c);

(e) forming a contact hole through said interlayer insulating film such that said contact hole reaches said metal wire; and (f) forming a metal film which will define a pixel electrode such that said contact hole is filled with said metal film.

4. The method as set forth in claim 3, further comprising a step of (3') annealing said polysilicon film, said step (3') being to be carried out between said steps (3) and (4).

5. The method as set forth in claim 3, further comprising a step of (6) applying hydrogen plasma to said polysilicon film.

6. The method as set forth in claim 3, further comprising step of (g) forming a light-shielding film on said substrate.

7. A method of fabricating an active matrix substrate, comprising the steps of:
  (a) forming an electrically insulating film on a substrate composed of resin;
  (b) forming a diode on said electrically insulating film by:
    (1) forming an amorphous silicon film on said electrically insulating film;
    (2) doping impurity into said amorphous silicon film in a selected region thereof;
    (3) radiating laser beams to said amorphous silicon film for crystallizing said amorphous silicon film into a polysilicon film;
    (4) patterning said polysilicon film into an island;
  (c) forming a metal wiring such that said metal wire makes electrical contact with said island-shaped polysilicon film;
  (d) coating a photosensitive film over a product resulting from said step (c), exposing said photosensitive film to a light, and developing said photosensitive film to thereby form a pixel;
  (e) forming an interlayer insulating film all over a product resulting from said step (d);
  (f) forming a contact hole through said interlayer insulating film such that said contact hole reaches said metal wire; and
  (g) forming a metal film which will define a pixel electrode such that said contact hole is filled with said metal film.

8. The method as set forth in claim 7, further comprising the step of (d') annealing said base steps for smoothing said base steps, said step (d') being to be carried out between said steps (d) and (e).

9. The method as set forth in claim 7, wherein said interlayer insulating film is formed of the same material as the material of which said base steps are formed, in said step (e).

10. A method of fabricating an active matrix substrate, comprising the steps of:
  (a) forming an electrically insulating film on a substrate composed of resin; and
  (b) forming a polysilicon thin film diode on said electrically insulating film.

* * * * *

UNITED STATES PATENT AND TRADEMARK OFFICE
CERTIFICATE OF CORRECTION

PATENT NO. : 7,157,315 B2
APPLICATION NO. : 10/778442
DATED : January 2, 2007
INVENTOR(S) : Okumura et al.

It is certified that error appears in the above-identified patent and that said Letters Patent is hereby corrected as shown below:

Col. 8, line 55,

"$2=10^{15} cm^{-2}$" should be --$2 \times 10^{15} cm^{-2}$--.

Col. 14, line 59,

"FIG. 1F" should be --FIG 11F--.

Claim 3(b), Col. 18, line 56, "by;" should be --by:--.

Claim 6, Col. 19, line 16, "step" should be --a step--.

Signed and Sealed this

Eighth Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 7,157,315 B2
APPLICATION NO. : 10/778442
DATED : January 2, 2007
INVENTOR(S) : Hiroshi Okumura It is certified that error appears in the above-identified patent and that said Letters Patent is hereby corrected as shown below:

Title Page;

Under REFERENCES CITED at (56):

Add the following references:
5,681,759
4,678,542
5,818,560

Signed and Sealed this
Twelfth Day of July, 2011

David J. Kappos
*Director of the United States Patent and Trademark Office*